United States Patent [19]

Wiesmann

[11] Patent Number: 4,634,605
[45] Date of Patent: Jan. 6, 1987

[54] METHOD FOR THE INDIRECT DEPOSITION OF AMORPHOUS SILICON AND POLYCRYSTALLINE SILICONE AND ALLOYS THEREOF

[76] Inventor: Harold J. Wiesmann, Vactronic Lab. Equipment, Inc., 65 Brightside Ave., E. Northport, N.Y. 11731

[21] Appl. No.: 755,668

[22] Filed: Jul. 16, 1985

Related U.S. Application Data

[63] Continuation-in-part of Ser. No. 613,310, May 23, 1984, abandoned.

[51] Int. Cl.$^4$ ................... C23C 16/24; C23C 16/32
[52] U.S. Cl. ........................... 427/249; 427/85; 427/86; 427/87; 427/255; 427/255.1; 427/255.2; 427/255.3; 427/255.5
[58] Field of Search ............... 427/248.1, 249, 250, 427/251, 252, 255, 255.1, 255.2, 255.3, 255.5, 85, 86, 87; 428/446

[56] References Cited

U.S. PATENT DOCUMENTS

| | | | |
|---|---|---|---|
| 3,627,569 | 12/1971 | Beecham | 427/248.1 |
| 4,100,879 | 7/1978 | Goldin et al. | 427/255.5 |
| 4,237,150 | 12/1980 | Wiesmann | 428/446 |
| 4,237,151 | 12/1980 | Strongin et al. | 428/446 |
| 4,262,630 | 4/1981 | Bochkarev et al. | 427/248.1 |
| 4,400,409 | 8/1983 | Izu et al. | 427/85 |
| 4,430,149 | 2/1984 | Berkman | 427/255.5 |

Primary Examiner—Sadie L. Childs
Attorney, Agent, or Firm—Connolly & Hutz

[57] ABSTRACT

This invention relates to a method and apparatus for depositing films of amorphous and polycrystalline silicon and alloys thereof, by thermally decomposing a silicon bearing gas or gases and depositing the film onto a temperatured controlled substrate. The area of the heated surface is less than the area of the substrate. The substrate moves relative to independent of and outside of the heated surface.

29 Claims, 5 Drawing Figures

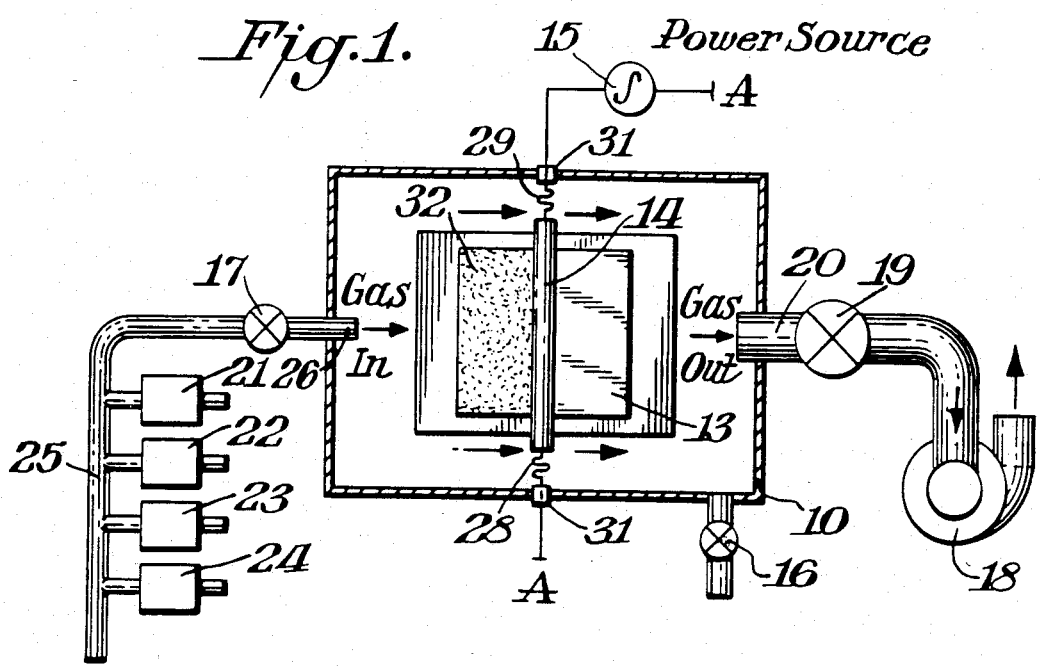
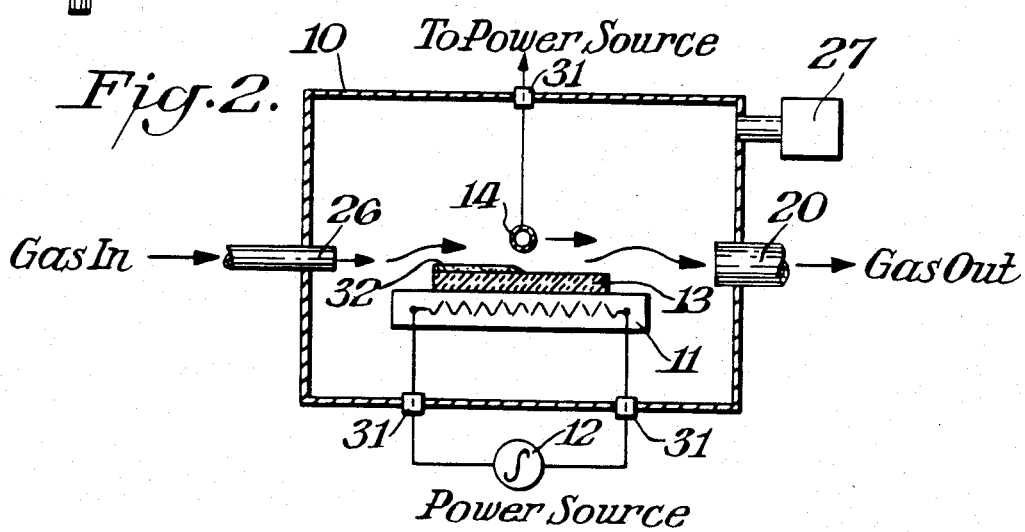
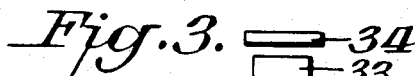
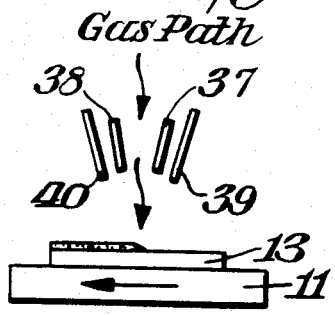

METHOD FOR THE INDIRECT DEPOSITION OF AMORPHOUS SILICON AND POLYCRYSTALLINE SILICONE AND ALLOYS THEREOF

CROSS-REFERENCE TO RELATED TO APPLICATION

This application is a continuation-in-part of application Ser. No. 613,310, filed May 23, 1984, now abandoned.

BACKGROUND OF THE INVENTION

This invention relates to improved methods and apparatus for depositing thin films of hydrogenated amorphous silicon semiconductor materials. Films of hydrogenated amorphous silicon have particular utility for semiconductor applications known in the art such as photovoltaic solar cells, optical sensors, electrophotography, thin film transistors, luminescent displays, optical data recording media and the like. the properties of amorphous silicon semiconductor thin films have been found to depend critically on deposition conditions such as growth rate, chemical precursor species distribution, impurities and temperature of growth. Reproducibly achieving the desired properties has been the object of much research effort.

Deposition of amorphous silicon films is conventionally accomplished by glow discharge decomposition of silane such as described in U.S. Pat. No. 4,064,521 issued Dec. 20, 1977 to D. E. Carlson. Glow discharge processes for depositing amorphous silicon semiconductor thin films utilize plasmas for generating silicon containing radicals which are precursors to film growth. By careful control of gas composition, flow rate, pressure, plasma power, bias and substrate temperature, useful hydrogenated amorphous silicon semiconductor thin films have been obtained. However, glow discharge deposition of large areas is characterized by low film deposition rates, poor utilization of raw materials and the costly plasma generating and control equipment.

An alternative deposition technique is prolytic decomposition of disilane, commonly known as chemical vapor deposition. Chemical vapor deposition of hydrogenated amorphous silicon is described in an article by S. C. Gau et al entitled "Preparation of Amorphous Silicon Films by Chemical Vapor Deposition from Higher Silanes" which was published in *Applied Physics Letters,* Volume 39, No. 1, pp. 436–38, Sept. 1, 1981. In the chemical vapor deposition method, a substrate is heated to a temperature of at least 380° C. in the presence of disilane gas. However, amorphous silicon films grown at such temperatures have proven to be unsuitable.

Useful amosphous silicon semiconductor thin films have been deposited by thermal generation of the precursors to film growth. Earlier work of applicant is described in U.S. Pat. Nos. 4,237,150 and 4,237,151, the details of which are incorporated herein by reference thereto. These patents disclose methods for producing hydrogenated amorphous silicon by thermally decomposing a silicon bearing gas or gases.

U.S. Pat. No. 4,237,151 to Strongin et al, issued Dec. 2, 1980, describes feeding a silicon bearing gas into a tube heated to temperatures above 1700° C. wherein the gas thermally decomposes forming elemental silicon and hydrogen. The tube wall is provided with an opening, through which a flux of decomposition products effuses into vacuum less than $10^{-4}$ torr. The flux of hydrogen and silicon condense on a substrate to form film. A major disadvantage with the method of U.S. Pat. No. 4,237,151 is that the tube and opening radily become clogged with solid products of the decomposition reaction. Furthermore, when the temperature of the tube is raised or when the tube is placed closer to the substrate for the purpose of increasing the deposition rate, excess heating of the substrate occurs.

In applicant's U.S. Pat. No. 4,237,150 a stream of silicon and hydrogen bearing gas or gases, at a pressure of approximately $10^{-4}$ torr, is directed against a heated surface being approximately 1400° C. The silicon bearing gas decomposes on the heated surface and the resulting decomposition products are condensed onto a suitable substrate which is heated to a temperature of 600° C. or less. Condensing the thermal decomposition products of the gaseous mixture onto a substrate heated to approximately 225° C. resulted in films of hydrogenated amorphous silicon with low dark conductivity, high photoconductivity and dark conductivity activation energy of 0.7 eV. A problem with the methods disclosed in U.S. Pat. No. 4,237,150 is excessive heating of the substrate which occurs when the heated surface is put in close proximity to the substrate and the pressure of the gas are raised for the purpose of accelerating the deposition rate of the deposited film.

B. A. Scott et al, in an article entitled "Kinetics and Mechanism of Amorphous Silicon Growth by Homogeneous Chemical Vapor Deposition", published in *Applied Physics Letters,* Volume 39, pages 73–75 (1981), July 1, 1981, describe a technique wherein a thin film of hydrogenated amorphous silicon is grown on a substrate held at temperatures less than 400° C. In the technique of Scott et al, monosilane is pumped through a furnace heated reactor containing a pedestal with a nitrogen cooled metal block substrate holder. The walls of the reactor are heated to a temperature of 550° C. or higher. Silane gas, flowing through the tube at a pressure of 5 torr is decomposed in the region of the heated walls to produce reactive free radial intermediates which are believed to be silyene. The free radicals diffuse to the substrate wherein they react yielding the thin film of hydrogenated amorphous silicon. In order to maintain the desired substrate temperature for growing the film, the substrate was clamped to the metal block holder and the flow rate of nitrogen coolant adjusted.

A feature common to the methods of Scott et al and U.S. Pat. No. 4,237,150 is that they employ apparatus in which the area heated above the decomposition temperatures of the gas is equal to or greater than the area of the substrate. As a result, the heat load on the substrate is excessive and control of the substrate temperature requires elaborate cooling schemes which preclude low cost, high throughput production of large areas of substrate coated with amorphous silicon films having the desired properties.

SUMMARY OF INVENTION

An object of this invention is to provide a method and apparatus for the deposition of thin films of silicon, germanium, carbon, tin, boron and the like, alone or in mixture, with or without the halogens nitrogen, hydrogen, oxygen and the like.

A further object is to provide such a method and apparatus which avoids excessive heating of the substrate and the film deposited thereon while depositing the film at high rates on large substrate areas.

A still further object is to provide techniques for the deposition of oxides and nitrides of silicon, germanium, tin and the like, alone and in mixture.

Thin film deposition according to the instant invention is initiated by introducing a gas at a pressure greater than 0.01 torr into the space between the heated surface and the temperature controlled substrate with the thermal decomposition of the gas occurring in the region of the heated surface. The decomposition species resulting therefrom deposit as film on the temperature controlled substrate moving relative to and independent of the heated surface. The rate of movement of the substrate relative to the heated substrate is adjusted to obtain the desired film thickness and temperature of film growth.

An apparatus in accordance with the instant invention includes, as a novel feature, a heated rod which is adapted to passing over the substrate at a suitable distance from the substrate. The rod is capable of being passed back and forth over the substrate repeatedly. The area of the heated surface is substantially less than the area of the substrate. The dimensions of the rod, temperature of the rod and rate of passage across the substrate surface is selected so that a steady state heat balance on the substrate is established for the desired substrate temperature for the purpose of controlling substrate temperature.

THE DRAWINGS

FIG. 1 is a top plan view schematically illustrating an apparatus, including a heated rod and substrate in accordance with this invention;

FIG. 2 is a side elevation view of the apparatus shown in FIG. 1; and

FIGS. 3–5 are side views of portions of modified heated surface and substrate arrangements in accordance with this invention.

DETAILED DESCRIPTION

One preferred embodiment of the invention is shown in FIG. 1 and 2. The apparatus comprises a vacuum chamber 10 containing inside, a substrate plate 11 capable of being heated externally by an electrical circuit 12 as is known in the art. Upon the substrate platen 11 is placed a substrate 13 to be coated. Circuit 12 includes temperature sensors and electronic controllers whereby the temperature of substrate 13 is controlled. In accordance with the teachings of this invention, substrate 13 is temperature controlled at 600° C. or less. The substrate 13 may be metallic, semiconducting, insulating or refractory as is known in the art. Suspended above the substrate 13 at a distance of 0.5 to 4 cm is a rod 14. The surface of rod 14 is capable of being heated to a temperature of 1500° C. by means of an external electrical circuit 15 as is known in the art. The rod 14 is suspended from an arm, not shown. The arm, in turn, is connected to a mechanism, not shown for clarity, which is capable of moving the rod 14 right to left and left to right as shown in FIGS. 1 and 6. Such mechanisms are known to those skilled in the art.

Operation of the apparatus shown in FIGS. 1–2 is as follows. The substrate 13 to be coated is placed upon the substrate platen 11 via an access port, not shown, in the vacuum chamber 10 as is known in the art.

The vacuum apparatus vent valve 16 is closed as is the gas manifold valve 17. Vacuum pump 18 is started and vacuum valve 19 is opened. The gas is exhausted from inside the vacuum chamber 10 via the outlet port 20 to a pressure of about $10^{-6}$ torr. The gas manifold valve 17 is opened. The mass flow controllers 21, 22, 23, 24 are adjusted alone or in combination with the gases admitted by the mass flow controllers mixing in the manifold 25 and flowing into the vacuum chamber 10 via an injector 26, the composition of the resulting gaseous mixture determined by the operator. The gaseous mixture is exhausted by the vacuum pump 18. The pressure of the gaseous mixture and flow rate are determined, for example, by adjusting the mass flow controllers 21, 22, 23 and 24 and valve 19. The techniques described and other methods of adjusting the pressure and flow rate, for example using valve 17, are known in the art. According to the teachings of this invention, the pressure in the chamber is between 0.01 and 2 torr. The pressure in the chamber may be read by a capacitance manometer 27 or alternatively a thermocouple gauge, not shown. After establishing the desired pressure, flow rate and gaseous mixture, the substrate is heated to the desired temperature by contact to the substrate plate 11 with the platen heated directly by actuation of the electrical circuitry 12 external to the vacuum chamber 10. The surface of rod 14 is heated to the appropriate temperature, the temperature greater than the thermal decomposition temperature of the gaseous mixture. The rod is heated by the electrical circuit 15 external to the vacuum chamber 10. The electrical power is conducted to the rod 14 by flexible conducting wires 28 and 29 with the wires passing through the vacuum chamber wall via insulating electrical feedthrough 31. The rod 14 now heated above the thermal decomposition temperature of the gaseous mixture is passed over the substrate 13. The rod 14 is put in motion and passes right to left over the substrate 13. The gaseous mixture in the region of rod 14 is thermally decomposed and the gaseous decomposition products react and/or condense on the substrate 13. The substrate now has deposited a thin film 32 thereupon.

After passing over the substrate 13 and depositing a thin film 32 thereupon, the heated rod 14 may be passed repeatedly over the substrate 13 increasing the thickness of the thin film. The rate of passage of the heated rod 14 is fast enough to avoid excessive heating of the substrate 13 and the thin film 32.

The dimensions of rod 14, distance to substrate 13, the rate of passage and the geometry of the chamber are determined by the heat balance on the substrate and the rate of deposition. Procedures for such determination are generally known in the mechanical and chemical engineering arts. For example, G. O. Bennett and J. E. Meyers Momentum, Heat and Mass Transfer, McGraw-Hill, New York, 1962, Chapter 2, describe the fundamentals of heat transfer and applications to design of chemical processing equipment. Heat transfer between the rod and substrate in the apparatus of this invention is primarily radiative. The flow of energy from the rod to the substrate is governed by the emissivities of each surface, the absorbtivity of the substrate, the temperature of each surface, the effective area or view-factor, and the relative balance on the substrate also includes radiative heat transfer between the substrate and the walls of the chamber and conductive heat transfer between the substrate and the platen. In accordance with the teachings of this invention, the area of the substrate is greater than the area of the heated surface of the rod; and the rod and substrate move relative to and independent of each other. The dimensions of the rod, the spacing and the rate of movement are selected in order to provide the desired film growth rate at the desired substrate temperature.

Operating parameters illustrative of the method of the instant invention might be as follows: Gaseous mixture comprising one-half part silane and one-half part helium; Silane pressure about 0.5 torr and helium pressure about 0.5 torr yielding a total pressure of about 1.0 torr; Silane flow rate about 50 sccm and helium flow rate about 50 sccm yield a total flow rate of 100 sccm; Substrate diameter 4 inches, rod length about 6 inches, the distance from the substrate to rod about 1 cm; Rod temperature about 800° C. and substrate temperature about 230° C.

The silicon bearing gas may be selected from the group consisting of silicon tetrafluoride and silicon hexafluoride alone or in mixture thereof, with the gases being in combination of with hydrogen. In addition the gas may comprise at least one gas bearing at least one metallic element selected from the group consisting of organometallic methyl alkyls and organometallic ethyl alkyls.

Another embodiment of the instant invention is shown in FIG. 3. In this embodiment the vacuum chamber and ancillary devices are as shown in FIGS. 1-2. The heated surface 33 is of a different design. The heated surface comprises a rectangular strip which can be heated by wires, not shown. The rectangular strip 33 is in close proximity to, but not in contact with a thermally insulating rectangular strip 33 faces the substrate 11. In this embodiment the insulated strip 34 serves to make the process more efficient. The thermally insulating rectangular strip 34 prevents decomposition of the gas or gases on the top surface of the heated rectangular strip 33 with the tip surface in close proximity to, but not in contact with the insulating rectangular strip 34.

The embodiment of FIG. 4 is an extension of the embodiment illustrated in FIG. 3. In FIG. 4 the height of the insulating rectangular strip 35 is extended and in contact with the top of the vacuum chamber 10. The insulating rectangular strip 35 is in contact with the supports and rectangular heated strip 33. This configuration forces the gas or gases to be thermally decomposed to transverse the space between the heated surface 33 and the substrate 13. The thermally insulated strip and heated surface in contact therewith are stationary. The substrate 13 and heated platen 11 move back and forth under the heated surface 33 by a mechanism 36, not shown in detail for clarity.

The embodiment of FIG. 5 is an example of a configuration which combines two heated surfaces 37 and 38 each heated surface 37 and 38 in combination with but not in contact with insulated strips 39 and 40. The heated surfaces 37 and 38 are stationary and the substrate 13 in combination with the heated platen moves left to right or right to left with respect to said heated surfaces 37 and 38. The thermal barriers 34, 39 and 40 may be in contact with the heated surfaces 33, 37 and 38 under conditions known to those skilled in the art of thermally insulating barriers.

The heated surfaces in the various embodiments have in common the following features:

(a) A heated surface described by three orthogonal dimensions having at least one dimension greater than the maximum dimension of the substrate, the substrate normally comprising a flat plate or disc. In this configuration the heated surface is known in the art as a line source.

(b) A gas or gases to be thermally decomposed in the region of the heated surface. The gaseous species produced by the thermal decomposition on the heated surface or surfaces deposit on temperature controlled substrate.

(c) The area of the heated surface that is effective for radiative heat transfer to the substrate is less than the area of the substrate.

(d) The heated surface is in relative motion with respect to the substrate. The rate of motion is determined by the process parameters and the geometry of the apparatus. The substrate may be stationary and the heated surface in motion, or the heated surface stationary and the substrate in motion. This feature avoids excessive heating of the substrate by radiation or convection. The relative motion of the heated surface and substrate may be repeated until the thickness is independent of and outside of the source of thermal decomposition.

What is claimed is:

1. A method of depositing a thin film of a material on a substrate comprising the steps of:
  a. placing the substrate in a chamber containing a member having a surface capable of being heated to a temperature greater than 600° .C and the member having a heated surface area less than the area of the substrate;
  b. introducing a gas into the chamber, the gas containing chemical precursors of the material;
  c. maintaining a pressure in the chamber of at least 0.01 Torr;
  d. controlling the temperature of the substrate to a temperature below 600° C. by providing a source of heat to the substrate;
  e. applying heat to the member to maintain the temperature of the member greater than the decomposition temperature of the gas to thermally decompose the gas into decomposition products; and
  f. moving the member and substrate relative to each other to deposit the gas decomposition products as a thin film on the temperature controlled substrate with the relative movement being at a rate selected to avoid exessive heating of the substrate.

2. The method according to claim 1 wherein the member comprises a shape with three orthogonal dimensions, having at least one dimension greater than the maximum dimension of the substrate, and having the dimension of the member greater than the remaining two orthogonal dimensions of the heated surface.

3. The method according to claim 2 wherein the member is at least in close proximity with a thermally insulating material or in contact therewith.

4. The method according to claim 3 wherein the member comprises at least two heated surfaces in at least close proximity or in contact therewith.

5. The method according to claim 1 wherein the gas is in dynamic flow.

6. The method according to claim 1 wherein the gas is static.

7. The method according to claim 1 wherein the substrate is heated to a temperature in the range of 25°-600° C.

8. The method according to claim 1 wherein the gas is a silicon bearing gas.

9. The method according to claim 8 wherein the silicon bearing gas is selected from the group consisting of silane and disilane, alone or in mixture thereof.

10. The method according to claim 9 wherein the silicon bearing gas is in combination with an additional gas.

11. The method according to claim 1 wherein the gas comprises at least one gas bearing at least one element selected from the group consisting of boron, germanium and tin alone or in combination.

12. The method according to claim 1 wherein the gaseous mixture is deposited on the substrate yielding a film lying upon and in contact with the substrate.

13. The film according to claim 12 wherein the deposited film is amorphous silicon.

14. The method according to claim 13 wherein the amorphous film is in combination with a substance selected from the group consisting of hydrogen and a halogen alone or in mixture.

15. The method according to claim 13 wherein the amorphous silicon film is doped with a substance selected from the group consisting of phosphorous, arsenic and antimony alone and in combination for n(+) conductivity.

16. The method according to claim 13 wherein the amorphous silicon film is doped with a substance selected from the group consisting of boron, aluminum and gallium alone and in combination for p(+) conductivity.

17. The film according to claim 12 wherein the deposited film is a material selected from the group consisting of microcrystalline silicon and polycrystalline silicon.

18. The method according to claim 17 wherein the microcrystalline film is in combination with a substance selected from the groups consisting of hydrogen and a halogen alone or in mixture.

19. The method according to claim 17 wherein the deposited film is doped with a substance selected from the groups consisting of phosphorous, arsenic and antimony alone and in combination for n(+) conductivity.

20. The method according to claim 17 wherein the deposited film is doped with a substance selected from the group consisting of boron, aluminum and gallium alone and in combination for p(+) conductivity.

21. The method according to claim 12 wherein the film is amorphous and selected from the group consisting of silicon oxide, silicon nitride and silicon carbide alone or in mixture.

22. The method according to claim 21 wherein the amorphous film is in combination with a substance selected from the group consisting of hydrogen and halogen alone or in mixture.

23. The method according to claim 21 wherein the amorphous film is doped with a material selected from the group consisting of phosphorous and arsenic for n(+) conductivity.

24. The method according to claim 21 wherein the amorphous film is doped with boron for p(+) conductivity.

25. The method according to claim 1 wherein a plurality of heated surfaces pass over the substrate in sequence, the members moving relative to and independent of the substrate.

26. The method according to claim 8 wherein the silicon bearing gas is selected from the group consisting of silicon tetraflouride and silicon hexaflouride alone or in mixture thereof, said gases in combination with hydrogen.

27. The method according to claim 1 wherein the gas comprises at least one gas bearing at least one metallic element selected from the group consisting of the organometallic methyl alkyls and the organometallic ethyl alkyls.

28. The method according to claim 27 wherein said gas is in combination with at least one additional gas.

29. The method according to claim 1 wherein the member is moved over the substrate.

* * * * *

UNITED STATES PATENT AND TRADEMARK OFFICE
CERTIFICATE OF CORRECTION

PATENT NO. :   4,634,605
DATED      :   January 6, 1987
INVENTOR(S) :  Harold J. Wiesmann It is certified that error appears in the above-identified patent and that said Letters Patent is hereby corrected as shown below:

Title page:

Line 76, should read Harold J. Wiesmann, 32 Meadow Drive, Stoney Brook, N.Y. 11790.

Signed and Sealed this

Twentieth Day of October, 1987

Attest:

DONALD J. QUIGG

Attesting Officer

Commissioner of Patents and Trademarks